United States Patent [19]

Hino et al.

[11] Patent Number: 5,321,885
[45] Date of Patent: Jun. 21, 1994

[54] METHOD AND APPARATUS FOR MANUFACTURING PRINTED WIRING BOARDS

[75] Inventors: Toshikatsu Hino; Masakazu Kobayashi; Shozo Suzuki; Satomi Furukawa, all of Kawasaki, Japan

[73] Assignee: Fujitsu Limited, Kawasaki, Japan

[21] Appl. No.: 945,659

[22] PCT Filed: Mar. 11, 1992

[86] PCT No.: PCT/JP92/00291
§ 371 Date: Nov. 12, 1992
§ 102(e) Date: Nov. 12, 1992

[87] PCT Pub. No.: WO92/17047
PCT Pub. Date: Jan. 10, 1992

[30] Foreign Application Priority Data

Mar. 18, 1991 [JP] Japan ................................ 3-77136
Mar. 18, 1991 [JP] Japan ................................ 3-77137

[51] Int. Cl.⁵ ........................ H05K 3/30; B23P 23/00
[52] U.S. Cl. ........................ 29/832; 29/338; 29/564; 29/564.1; 29/840; 209/573; 414/786
[58] Field of Search ............ 29/338, 840, 739, 740, 29/832, 741, 564, 564.1; 209/573; 414/786

[56] References Cited

U.S. PATENT DOCUMENTS

| 4,348,276 | 9/1982 | Tateishi et al. | 209/573 |
| 4,667,403 | 5/1987 | Edlinger et al. | 209/573 X |
| 4,674,181 | 6/1987 | Hamada et al. | 29/33 P |
| 5,117,555 | 6/1992 | Hunt et al. | 29/740 X |
| 5,193,268 | 3/1993 | Ono et al. | 29/739 |

FOREIGN PATENT DOCUMENTS 152183 8/1985 European Pat. Off. ............ 29/729

Primary Examiner—Carl J. Arbes

[57] ABSTRACT

A system for manufacturing printed circuit board units having facilities for automatically performing a component replacement work or component replenishment work which may take place during the changeover of products and ensuring an effective flexible manufacture of the printed wiring board units includes a plurality of the processing cells. Conveyance passages, on which automatic conveying vehicles travel, extend across the processing cells. Along the conveyances passages, there are provided storages opposite to the processing cells. Predetermined electronic components are arranged in advance onto a pallet in a predetermined sequence by an automatic on-pallet arranging unit provided separately from the processing cells, and the pallet is supplied into the processing cells.

10 Claims, 12 Drawing Sheets

METHOD AND APPARATUS FOR MANUFACTURING PRINTED WIRING BOARDS

BACKGROUND OF THE INVENTION

1. Field of the Invention

The present invention generally relates to a system for manufacturing printed circuit boards and a method of manufacturing the same, and more particularly, to a system and a method for the manufacture of the printed circuit boards suitable for effectively manufacturing different kinds of printed circuit boards in small numbers.

2. Related Art

Electronic equipment such as communication equipment generally comprises printed circuit board units (or electronic circuit packages) loaded into a shelf and consisting of printed circuit boards and electronic components mounted thereon. In the field of making industrial products such as communication equipment, particularly, the diversification of the customers' needs requires a flexible manufacture of the printed circuit boards, which inevitably leads to an increase in kinds of printed circuit boards and to a demand for the establishment of the way of effectively manufacturing different kinds of such products in small numbers.

A typical production control system includes a conveyance means such as a driverless, automatic conveying vehicle travelling between a plurality of processing or manufacturing cells or units (processing equipment) and storage units for storing products, a process controller for controlling the processing units, a conveyance controller for the control of the conveyance means, and a host computer which interchanges information with the above-mentioned controllers and issues instructions to the controllers in accordance with a work planning and a process sequence. The production control system called FMS (Flexible Manufacturing System) presents a production system capable of coping with a flexible manufacture and executing desired operations while passing a variety of products between the processing cells in accordance with the predetermined procedure.

The conventional methods of manufacturing printed circuit boards include an in-line system in which the processing units are placed in series by way of conveyors, and a parallel line system in which the processing units are arranged in parallel and the printed wiring boards are loaded into or unloaded from the processing units by means of the automatic conveying vehicles.

FIG. 1 schematically shows a conventional in-line system having a plurality of processing cells or units 1a and 1b linked in series by conveyors 2. A rack 3 containing a plurality of printed circuit boards on which electronic components are to be mounted, is loaded onto the conveyor 2 through a loader 4, and is conveyed by the conveyor 2 in the direction shown by arrow A. In the processing cells or units 1a and 1b, the printed circuit boards are removed from the rack 3 for the predetermined operations, and then are passed into the downstream processing units by conveyor 2. The printed circuit boards which have been thus completed through the variety of processing steps are discharged by an unloader 5.

FIG. 2 diagrammatically shows a conventional parallel line system having a plurality of processing cells or units 6a, 6b, . . . , 6n arranged in parallel along which a conveyance passage 7 extends. An automatic conveying vehicle 8 travels on the conveyance passage 7. A loader/unloader 9 designed to load and unload the rack 3 containing a plurality of printed circuit boards is provided on each of the processing cells or units 6a, 6b, . . . , 6n.

The rack 3 containing a plurality of printed circuit boards is mounted on the automatic carrying vehicle 8 through the loader 4, and brought into any one of the processing cells or units 6a, 6b, . . . 6n by way of their respective loader/unloaders 9 in accordance to a working procedure. In the processing cells or units 6a, 6b, . . . 6n, the printed circuit boards are dispensed from the rack 3 to undergo a predetermined operation and returned into the rack 3. The printed circuit boards are then transferred to the subsequent processing cells or units 6a, 6b, . . . , 6n on the basis of the working scheme. After the completion of all the processing operations, the finished printed circuit boards are ejected through the unloader 5.

Referring to FIG. 3, there is shown another conventional example of the parallel line system. Across a plurality of processing cells or units 12a to 12e arranged in parallel, is provided a passage 14 on which an automatic driverless vehicle 15 travels for carrying and loading workpieces, such as printed circuit boards, into the processing cells or units 12a to 12e. The processing cells 12a to 12e include their respective loaders/unloaders 13 for loading and unloading of the workpieces. Perpendicular to the passage 14, there extends a second passage 16 on which a stacker crane 17, having an automatic loading/unloading function, travels. Storage units 18 are disposed along each side of the second conveyance passage 16.

In the conventional parallel line system as shown in FIG. 3, the workpieces, such as printed circuit boards, stored within the storages 18, are dispensed onto the automatic vehicle 15 with the aid of the stacker crane 17, and transported to the desired processing cells 12a to 12e.

However, the in-line system shown in FIG. 1 and the parallel line system shown in FIG. 2 are both production lines having only processing cells or units, and hence involve the following problems.

(1) For the flexible manufacture, both manufacturing systems require that the processing or manufacturing units should be constructed to enable an arrangement or a replacement and replenishment of electronic components to be mounted on the printed circuit boards when changing the types of the printed circuit boards being made. At the time of such change in kinds of the products, e.g., printed circuit boards, the processing units are deenergized and hence the operating time of these units is adversely reduced. In the case of a chip component mounting machine, for example, the actual operating time thereof is in the order of 50 through 60% of the entire manufacturing time, with the remainder spent on the arrangement of the components or the like.

(2) Although the printed circuit boards are manufactured by the processing units in accordance with the manufacturing process, the processing time in each of the processing units at each processing step is not fixed due to the different requirements of operation. As a result, the processing units in less loaded processing steps remain idle and have a long waiting period for subsequent workpieces to arrive and be processed, which disadvantageously results in poor productivity of the production line.

On the other hand, the conventional production line shown in FIG. 3 has a problem that the storage units and the automatic vehicle must be separately and systematically controlled, which leads to a complicated control as well as higher production costs of the system. There also arises another problem that the distance of conveying the printed circuit boards can be long, and the productivity of the system is impaired in case the workpieces are to be temporarily withdrawn into the storage u its due to the fact that the workpieces cannot be conveyed between the processing units. Moreover, it takes an excessive time to transfer the workpieces when it is required that the workpieces be taken out from the storage units, because they are transferred by the automatic vehicle after the movement of the stacker crane.

In addition, the conventional automatic conveying vehicles travel at a relatively slow running speed of the order of 30 m/min. due to the travel on the floor in the factory, which results in further deficiency of the conveying process.

SUMMARY OF THE INVENTION

It is therefore an object of the present invention to provide a system for manufacturing printed circuit boards and a method of manufacturing the same, having equipment capable of automatically performing component replacement work or component replenishment work which may take place at the time of changing the types of the products, and ensuring an effective and flexible production of the printed circuit boards.

Another object of the present invention is to provide a system for manufacturing printed circuit boards capable of temporarily storing the boards being manufactured through a shorter transfer route so as to ensure a prompt transfer of the workpieces into processing units as the need arises.

According to one aspect of the present invention, there is provided a system for manufacturing printed circuit boards, comprising a plurality of processing units which are capable of carrying out a variety of processing operations on printed circuit boards; an automatic cartridge arranging unit for mounting cartridges with predetermined electronic components onto a pallet in a predetermined sequence, the cartridge arranging unit including component storage units for storing the electronic components and an automatic arranging robot; conveyance passages extending along the plurality of processing units and the automatic cartridge arranging unit; storage means provided along the conveyance passages opposite to the plurality of processing units and the automatic cartridge arranging unit; a conveying means travelling on the conveyance passages and carrying pallets and/or racks loaded with a plurality of printed circuit boards among the plurality of processing units, the automatic cartridge arranging unit and the storage means; and a control means for controlling the plurality of processing units, the automatic cartridge arranging unit, the storage means and the conveying means in accordance with a predetermined work scheme.

Preferably, the control means includes a host computer in the first hierarchy which manages the entire system while monitoring the operative conditions of the entire system, and a plurality of computers in the second hierarchy linked with the host computer by a data bus and provided, respectively, on the plurality of processing units, automatic cartridge arranging unit, storage means and conveying means. The second hierarchy computers transmit instructions from the host computer to the plurality of processing units, automatic cartridge arranging unit, storage means and conveying means while monitoring the operative conditions thereof.

Preferably, the conveyance passages have a two-stage or two-part structure, correspondingly to which the storage means are of a two-stage or two-part structure, and the conveying means travel on their respective parts of the conveyance passages.

According to another aspect of the present invention, there is provided a method of manufacturing printed circuit boards capable of automatically mounting desired electronic components onto a printed circuit board, comprising the steps of preliminarily setting electronic components with an identifier into a cartridge also having an identifier; reading separately the identifiers of the electronic components and the cartridge to register the obtained setting data into an automatic arrangement controlling computer; storing the cartridge whose setting data have been registered into any address of a component storage in an automatic cartridge arranging unit while registering the address into the automatic arrangement controlling computer; positioning a pallet with an identifier into a predetermined position on the automatic cartridge arranging unit and registering the identifier of the pallet into the automatic arrangement controlling computer; generating data of locations of the cartridges to be set on the positioned pallet and data of components to be set by the automatic arrangement controlling computer in accordance with the mounting programs corresponding to drawing numbers and data regarding stocks within the component storages; setting applicable cartridges onto the pallet by an automatic robot on the basis of the data of locations of the cartridges to be set and data of components to be set so as to automatically arrange the cartridges on the pallet; transporting the pallet on which the arrangement of cartridges has been completed to automatic component mounting machines; and taking out the components from the pallet having the arranged cartridges by means of the automatic component mounting machines to automatically mount the components onto the printed circuit board at the predetermined positions.

One feature of the present invention is to preliminarily mount predetermined electronic components onto a pallet in a predetermined sequence by means of the automatic cartridge arranging unit provided independently of the processing units. In other words, the arrangement of the electronic components to be mounted on the printed circuit boards are automatically executed in advance by the automatic cartridge arranging unit.

Such arrangement of the components carried out in advance by the automatic cartridge arranging unit ensures a prompt supply of the electronic components called for the manufacture of different kinds of products into the predetermined processing units without stopping the operation of the processing units even at the time of the change in the types of products to be manufactured, which advantageously increases the efficiency of flexible manufacture.

In addition, the provision of the storage means along the conveying carriage allows semi-finished products produced in a less loaded processing plant to be temporarily stored within the storage means, which reduces the time for which the less loaded processing plant should wait for the subsequent workpieces and improves the productivity of the entire production line.

DETAILED DESCRIPTION OF THE PREFERRED EMBODIMENTS

An embodiment of the present invention will be hereinbelow described in detail with reference to the drawings.

Figure 1:
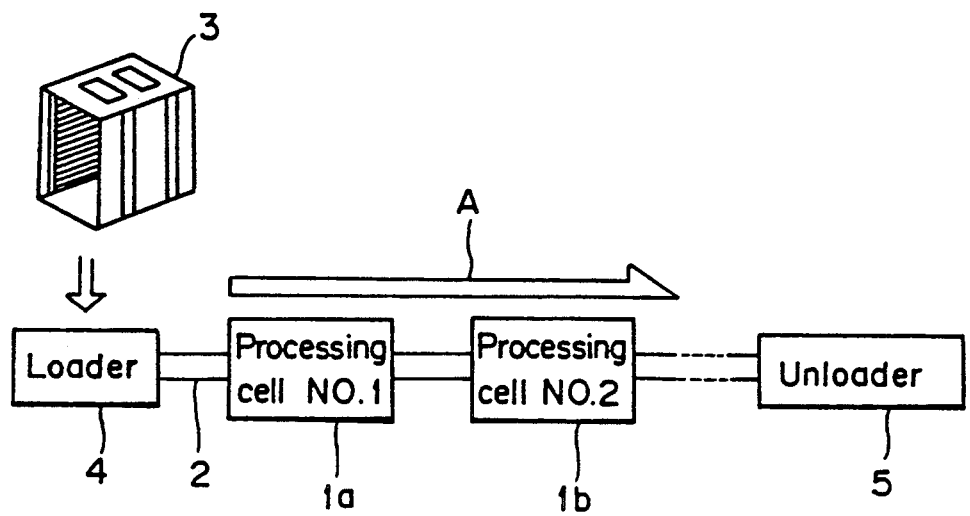
FIG. 1 is a schematic view showing a conventional in-line method.
Figure 2:
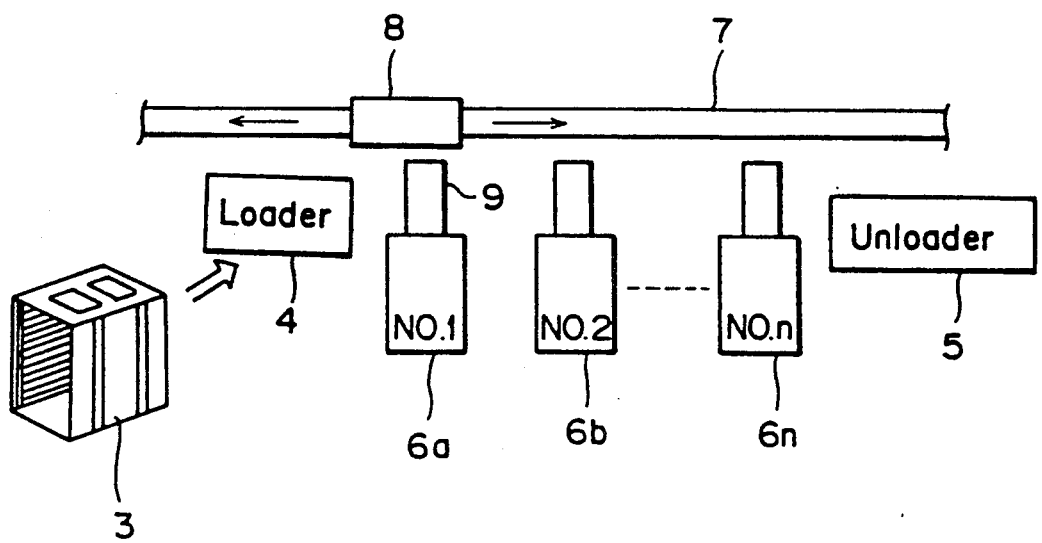
FIG. 2 is a schematic view showing a conventional parallel line method.
Figure 3:
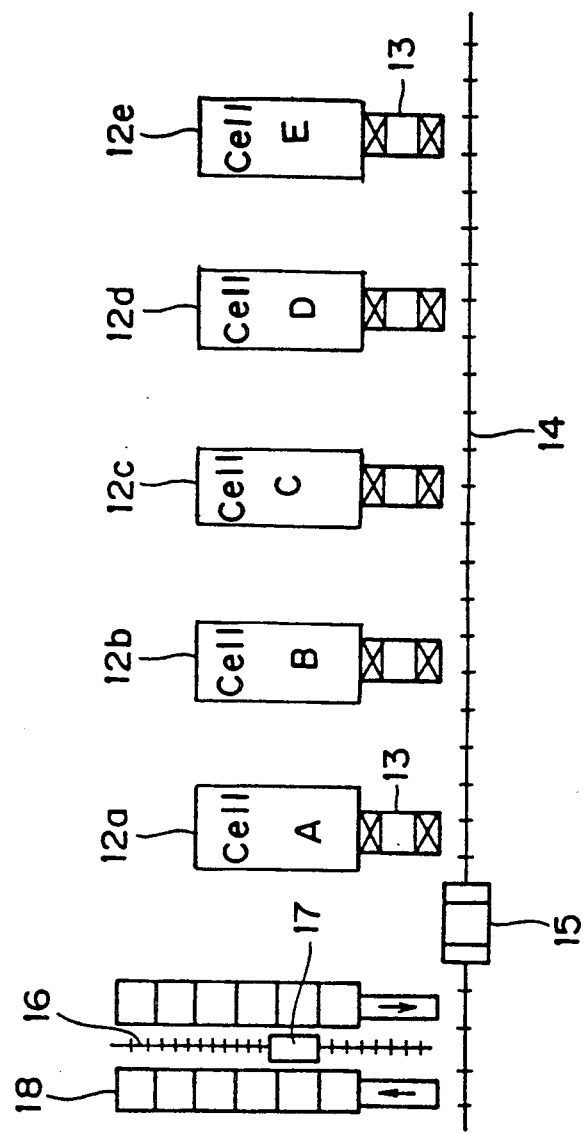
FIG. 3 is a schematic view showing another conventional parallel line method.
Figure 4:
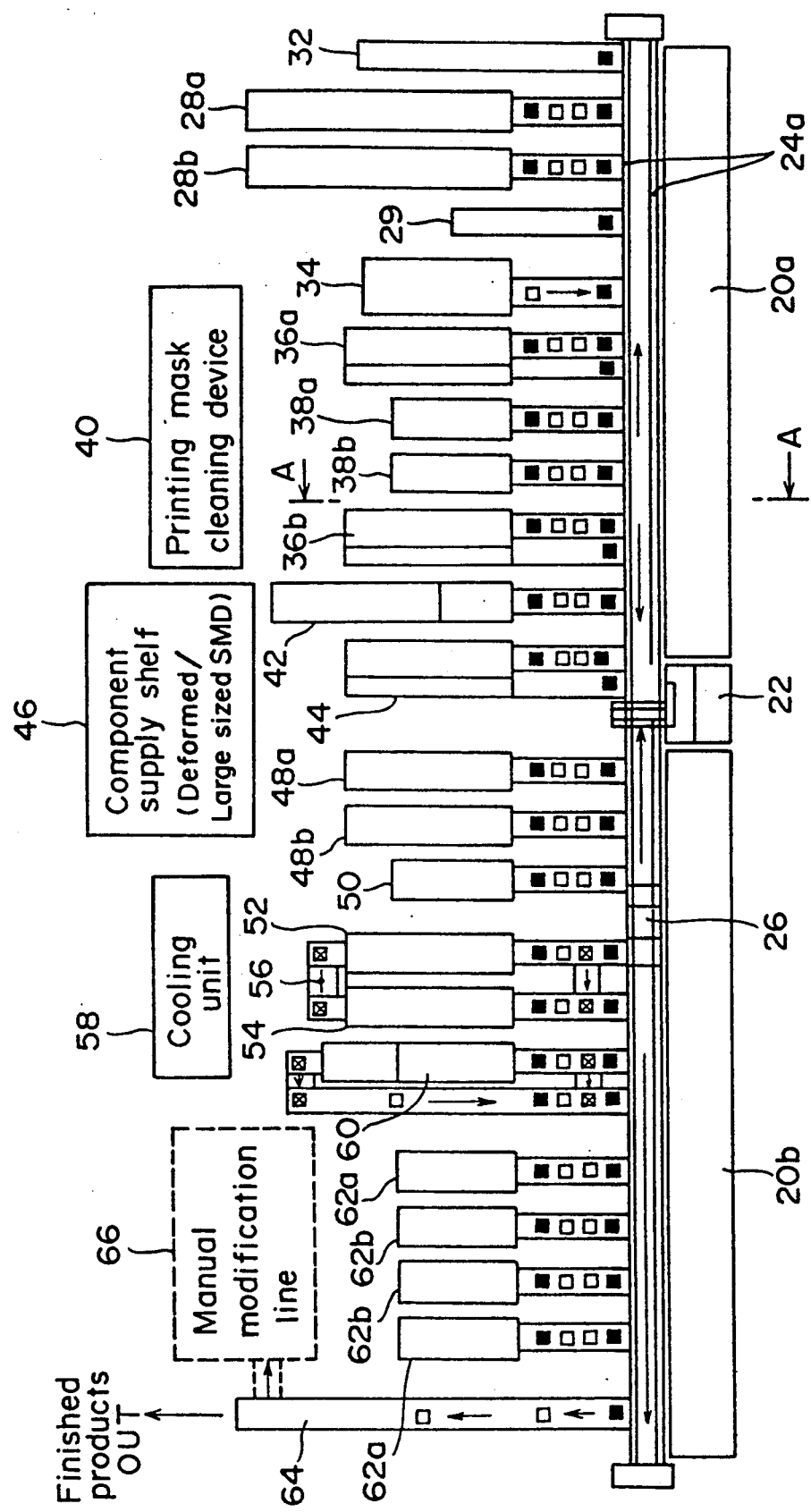
FIG. 4 is a general layout of a production system in accordance with one embodiment of the present invention.

Referring first to FIG. 4, there is shown an overall schematic layout of a production line or system of the present invention. Reference numerals 20a and 20b denote two-stage or two-part storages for storing racks and pallets. A rack delivery section 22 is interposed between the storages 20a and 20b. As apparent from FIG. 5, each of the storages 20a and 20b is of a two-stage or two-part configuration.

Along the storages 20a and 20b there is provided a two-part conveyance passage consisting of an upper conveyance passage 24a and a lower conveyance passage 24b, on which automatic conveying vehicles 26 travel. A couple of automatic conveying vehicles 26 are mounted on both the upper conveyance passage 24a and the lower conveyance passage 24b. The automatic conveying vehicles 26 are drivingly controlled to return to the middle of the conveyance passages.

Figure 5:
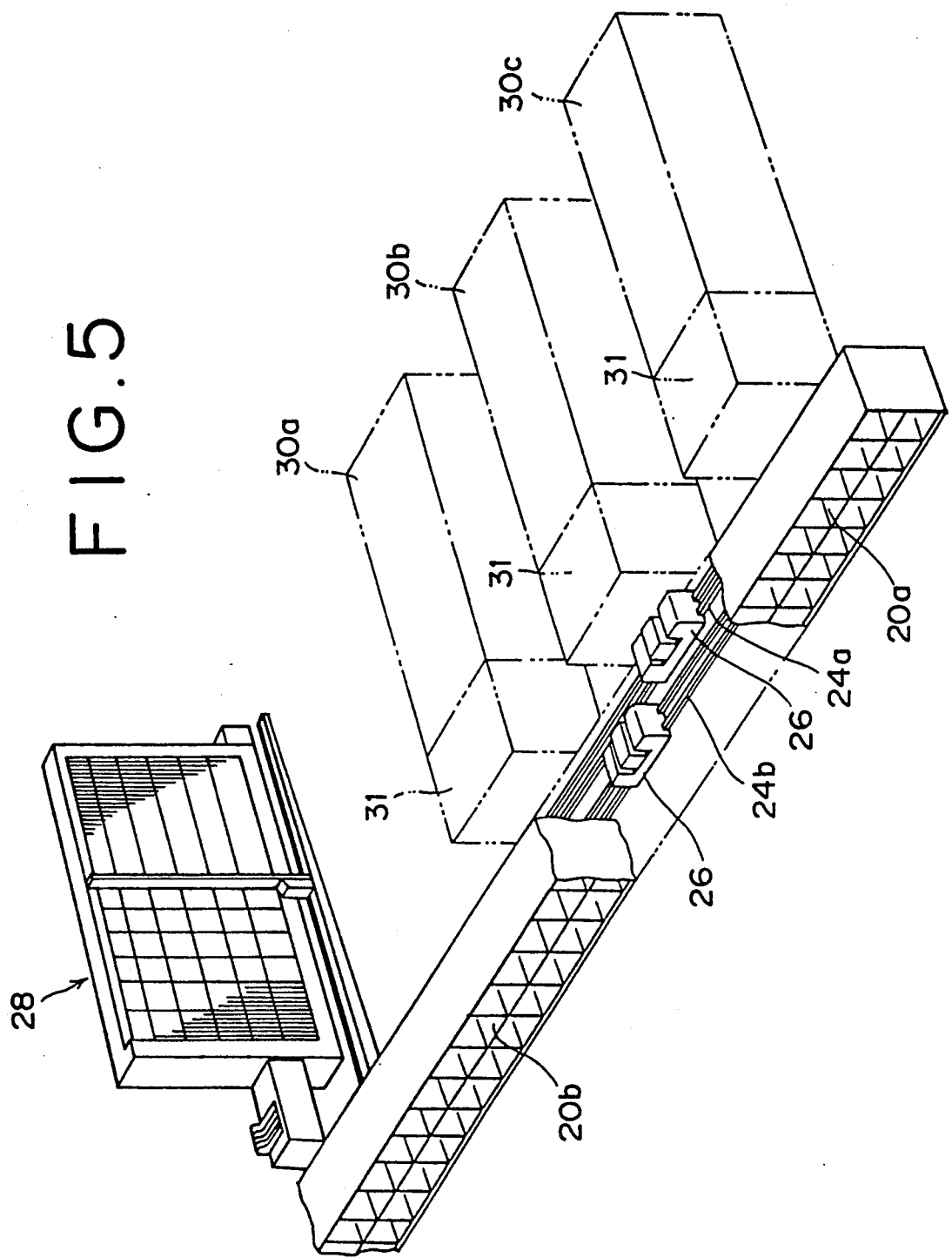
FIG. 5 is a schematic perspective view of the production system of the present invention.

As is diagrammatically shown in FIG. 5, opposite to the storages 20a and 20b along the conveyance passages, there are positioned a variety of processing units (processing cells) 30a, 30b, and 30c disposed in parallel. An automatic on-pallet cartridge arranging unit 28 extends transversely to and at the passages 24a, 24b. The processing cells or units 30a, 30b and 30c are each provided with a loader/unloader 31 for introducing racks and/or pallets into the associated processing cell or unit.

Figure 6:
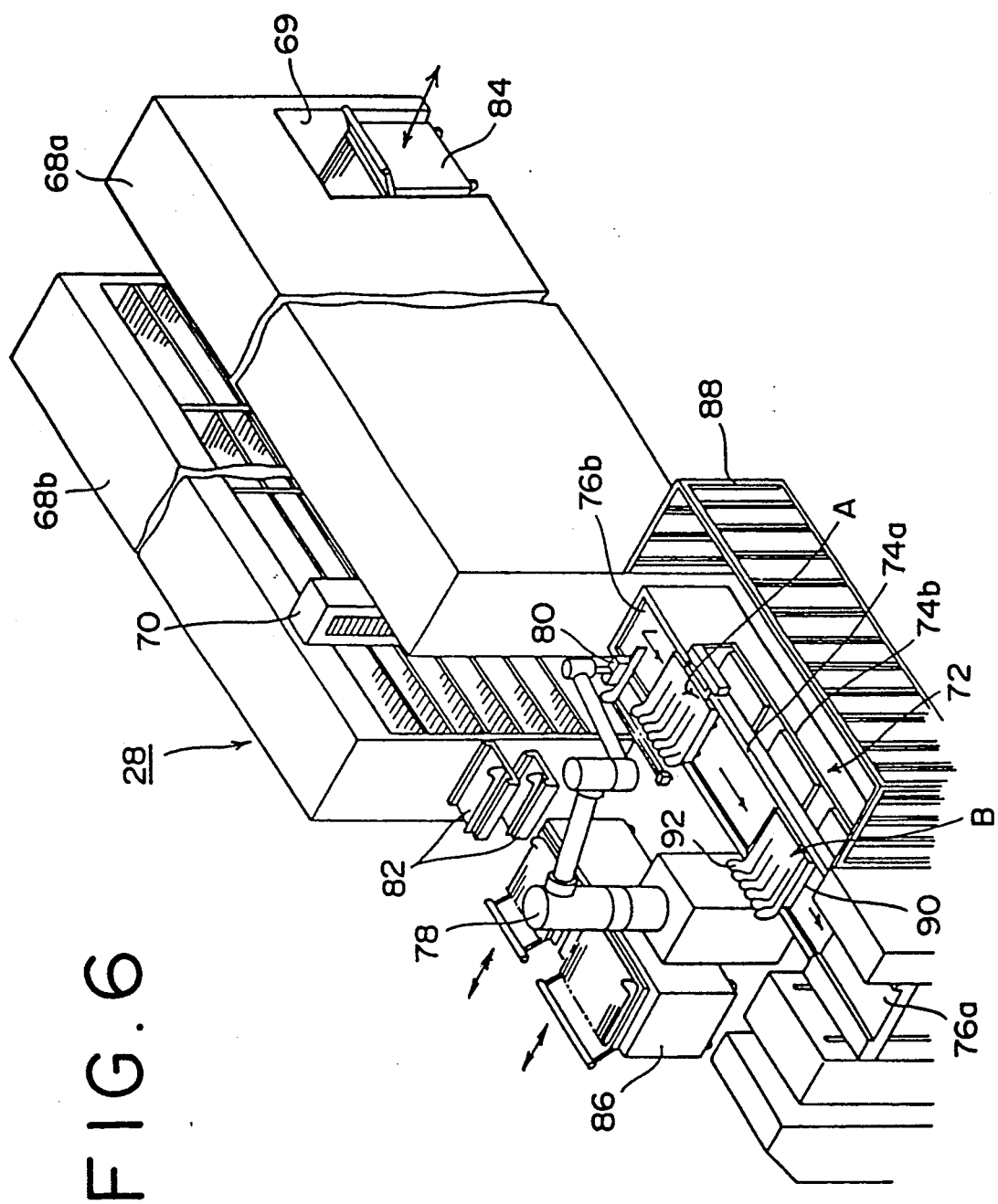
FIG. 6 is a perspective view of an automatic on-pallet cartridge arranging unit.
Figure 7:
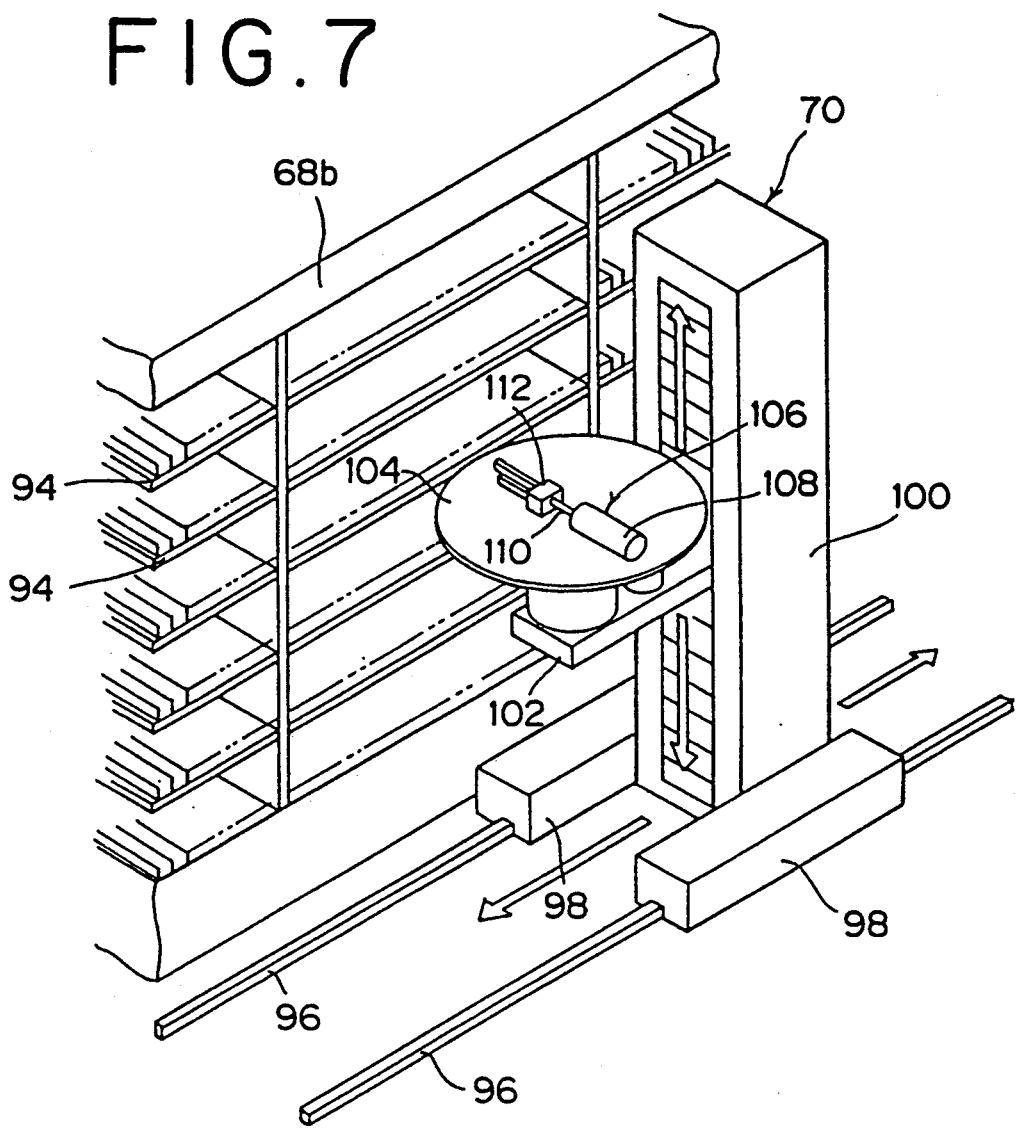
FIG. 7 is a perspective view of a cartridge in/out robot.

Referring back to FIG. 4, the processing cells or units constituting the production line will be outlined. A pallet conveyor 32 serves to feed the pallets into the production line. Automatic on-pallet cartridge arranging units 28a and 28b, which are principal parts in the production line of the present invention, operate to automatically arrange cartridges each having a plurality of surface mounted chip components mounted thereon onto the pallet in accordance with a predetermined program. The on-pallet cartridge arranging unit 128 is shown in FIGS. 6 and 7. Separately from the automatic on-pallet cartridge arranging units 28a and 28b, there is disposed a pallet arranging section 29 for manually arranging the pallets.

A bar code labeler 34 is an apparatus for attaching a bar code onto a printed circuit board and accommodating a predetermined number of boards into a preliminarily bar-coded rack. The printed circuit boards are received in the rack and supplied into the production line. When the printed circuit boards are loaded into the rack, the bar codes on both members are read by means of a bar code reader, and the resultant combined data are input into a computer. A small-sized SMD (Surface Mounting Device) mounting machines 36a and 36b function to automatically mount small-sized SMD's such as SOP's (Small Outline Packages) and chip components onto the printed circuit board. The small-sized SMD's are then supplied resting on the pallets previously arranged by the automatic on-pallet cartridge arranging units 28a and 28b.

Printers 38a and 38b perform screen printing in which a soldering paste is applied onto the printed circuit boards through a screen. Metallic masks for use in the printers are cleaned by a print mask cleaning device 40. A glue applicator 42 applies glue for temporarily fixing after the turning of the printed circuit board over in the case where components are mounted on the reverse side of the printed circuit board as well, which is not used for one side mount of the components.

A large-sized SMD mounting machine 44 is intended to automatically mount large-sized SMD's and has an accommodation space for the large-sized components to be mounted. The large-sized SMD's are accommodated in a component supply shelf 46. When no components are left in the large-sized SMD mounting machine, the latter takes out the large-sized SMD's from the component supply shelf 46 for supplying them. Deformed component mounting machines 48a and 48b are designed to automatically mount deformed components such as QFP's (Quad Flat Packages) and capacitors, and each have a space therein for accommodating components to be mounted in the same manner as the large-sized SMD mounting machine. The deformed components are also accommodated in the component supply shelf 46 which supplies new deformed components when the components to be mounted are used up within the deformed component mounting machines 48a and 48b. After the completion of the mounting of the components onto the printed circuit board, an inspecting instrument 50 optically inspects whether each of the components is mounted in position or not.

Reference numeral 52 designates a nitrogen gas reflow furnace which executes a reflow soldering under nitrogen gas atmosphere and is connected to a general cleaning device 54 by a traverse 56. An organic solvent used in the general cleaning device 54 is cooled down by a cooling device 58 and regenerated. Reference numeral 60 denotes a furnace for curing the glue applied by the glue applicator 42. For flow soldering, the boards are immersed in a separate soldering bath after curing of the glue.

Printed circuit boards onto which the predetermined components have been entirely mounted are forwarded to an X-ray visual inspection instrument 62a and an optical visual inspection instrument 62b to inspect the mounting conditions. The printed circuit boards which have undergone the inspections are discharged through a discharge station 64. A manual modification line 66 modifies the parts which have been turned out to be defective by means of the visual inspection instruments 62a and 62b. By an optical indicator linked with the computer, defective parts are automatically indicated to enable the operator to manually modify the defective parts.

Referring to FIGS. 6 and 7, the automatic on-pallet cartridge arranging unit 28 is shown, which automatically arranges surface mount chip components onto a pallet in a predetermined mounting sequence, and supplies them into the small-sized SMD mounting machines 36a and 36b. The chip components are typically supplied in the form of a reel (or a tape wound with elements equally spaced thereon) by component manufacturers. The components contained in the reel are identical.

The circuitry of the printed circuit board is composed of several tens of kinds of chip components. In order to automatically mount the chip components onto the printed circuit board with the aid of the automatic mounting machine, it is necessary to set these several tens of kinds of chip components into a position where the components are taken out in accordance with a mounting program. This setting is an arrangement operation. The present invention automatically executes such arrangement preliminarily at a location remote from the position where the components are taken out by the automatic mounting machine. This arrangement operation is accomplished by the automatic on-pallet cartridge arranging unit 28, as will be described hereinbelow.

As also shown in FIG. 6, the arranging unit 28 includes a pair of component storages 68a and 68b provided for storing the chip component reel mounted on a cartridge, and an automatic robot which includes a cartridge in/out robot 70 displaceably interposed between the component storages 68a and 68b and a cartridge arranging or mounting robot 78 shown in FIGS. 7 and 6, respectively. Reference numeral 72 denotes a loader/unloader including an upper and lower conveyors 74a and 74b extending between a pair of pallet lifters 76a and 76b.

Reference numeral 78 designates the cartridge arranging robot with multi-joints for automatically mounting a respective cartridge 92 onto a pallet 90 in accordance with the arrangement program and for taking out the cartridge from the returned pallet. The robot 78 has at its end a hand 80 for grasping the cartridge. At the side of the component storage 68b, there are disposed a pair of cartridge delivery units 82 for temporarily holding the cartridge when the cartridge is delivered from the cartridge in/out robot 70 to the cartridge arranging robot 78. Furthermore, the component storage 68a is provided with an opening (or a storage inlet) 69 through which new cartridges mounted on an introduction carriage 84 are introduced into the component storages 68a and 68b.

Reference numeral 86 signifies a vacant-cartridge-removal carriage. The vacant cartridge, which has been returned riding on the pallet 90, is removed from the pallet 90 by means of the cartridge arranging robot 78 and placed on the vacant cartridge removal carriage 86. The loader/unloader 72 and the cartridge arranging robot 78 are surrounded by a safety guard 88 for the purpose of preventing any danger to which the operator would be otherwise subjected.

Figure 8:
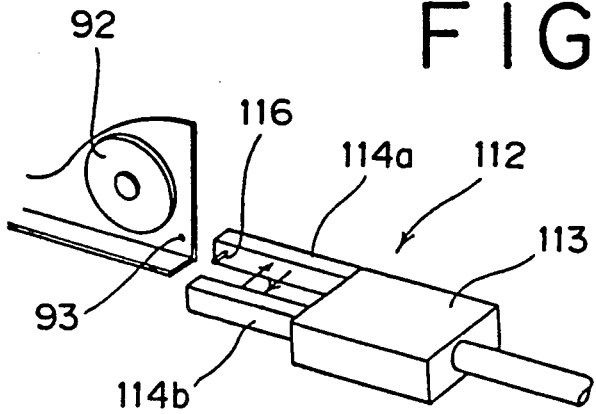
FIG. 8 is an enlarged view of a portion of the cartridge in/out robot.

The construction of the cartridge in-out robot 70 will be explained hereinafter with reference to FIGS. 7 and 8. The component storage 68b is equipped with a plurality of shelves 94 each having cartridge containing blocks to which addresses are imparted.

Along the component storage 868b, there are provided a pair of rails 96 on which sliding members 98 of the cartridge in-out robot 70 are slidable in the directions as shown by the arrows in FIG. 7. A vertically extending column 100 of robot 70 is fixedly secured to the slide members 98 and has a moving member 102 attached thereto displaceably in the vertical direction. The moving member 102 has a rotational disc 104 rotatably mounted thereon. The disc 104 in turn has a robot hand 106 thereon for grasping the cartridge when the cartridges are introduced into and taken out from the component storage 68b.

The robot hand 106 includes an air cylinder 108 having a piston rod 110, and an air chuck 112 capable of opening and closing in parallel and attached to the piston rod 110. The open/close air chuck 112, as shown in FIG. 8 on an enlarged scale, includes a body 113 having a pair of fingers 114a and 114b which are arranged in parallel and are displaceable toward or away from each other. One finger 114a has at its end a pin 116 engaging with a hole 93 provided in the cartridge 92.

The open/close air chuck 112 is extended by elongating the piston rod 110 of the air cylinder 108, thereby bringing the pin 116 into engagement with the cartridge 92 stored within the component storage 68b. The cartridge 92 can thus be taken out from the storage 68b. Attachment of the robot hand 106 onto the rotational disc 104 allows the cartridge to be introduced into or taken out from both component storages 68a and 68b.

Figure 9:
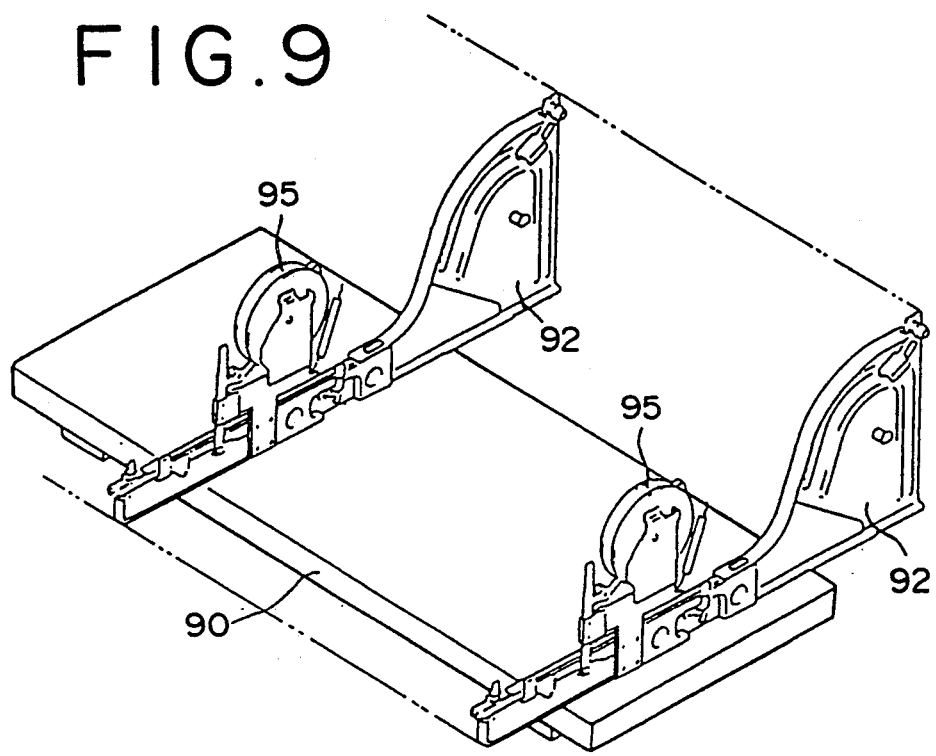
FIG. 9 is a perspective view showing a pallet loaded with cartridges.

As illustrated in FIG. 9, a plurality of (e.g., 30) cartridges 92 each loaded with chip components 95 rolled into a reel are automatically arranged on a pallet 90 by the above-described automatic cartridge arranging unit 28 in accordance with an arrangement program. In the production line of this embodiment, all of the chip component reels 95 are to be loaded into the respective cartridges 92 which are, in turn, loaded onto the pallet 90 for transporting.

The following is a description of a process of storing the chip component reels into the component storages 68a and 68b of the automatic cartridge arranging unit.

First, the chip component reel 95 with a bar code label is set in advance into the cartridge 92 also provided with a bar code label. At that time, the bar codes of the chip component reel 95 and the cartridge 92 are each read by the bar code reader, and obtained set data are registered into the automatic arrangement controlling computer. The cartridge 92 thus loaded with the chip component reel is carried by the cartridge introduction carriage 84 and set at the storage inlet (or opening) 69 of the component storage 68a.

When the cartridge 92 is set at the storage inlet 69, the automatic arrangement controlling computer issues a storage-in instruction to the control section of the cartridge in/out robot 70. In response to this control instruction, the cartridge in/out robot 70 effects a cartridge introduction operation into the storage, whereby the cartridge 92 is stored within a vacant address of the component storages 68a and 68b, and the occupied address is registered into the automatic arrangement controlling computer.

Description will next be made of the procedure of the automatic arrangement in which the cartridge arranging robot takes out one cartridge depending on the instruction from the automatic arrangement controlling computer from among several hundreds of kinds of cartridges or more which are stored in the component storages 68a and 68b, and sets it at the designated location on the pallet 90.

The pallet 90 loaded with used cartridges or halfway used cartridges which have been transported by the automatic conveying vehicle 26 is positioned at a return cartridge take-out section A (shown in FIG. 6) of the upper conveyor 74a by way of corresponding pallet lifter 76a, lower conveyor 74b and the pallet lifter 76b of the loader/unloader 72. Then, the cartridge arranging robot 78 takes out a vacant cartridge from the pallet 90 onto a cartridge take-out carriage 86, while placing a partially used cartridge onto the cartridge delivery unit 82.

The cartridges resting on the cartridge delivery unit 82 are again stored into the storages 68a and 68b by the cartridge in-out robot 70, and the addresses with which the cartridges have been accommodated are registered in the automatic arrangement controlling computer. The pallet 90 from which the returned cartridges have been entirely taken out is transferred by the upper conveyor 74a to be positioned at a pallet arrangement section B (FIG. 6). Simultaneously, pallet positioning completion data and pallet ID are input to the automatic arrangement controlling computer.

The automatic arrangement controlling computer generates data of locations of cartridges to be set on the pallet 90 placed in a proper position and data of the components to be set on the basis of mounting programs corresponding to drawing numbers and stocks (cartridges loaded with the chip component reel and stored in the component storages). Subsequently, the automatic arrangement controlling computer retrieves addresses with which the components to be arranged on the pallet have been stored, and instructs the cartridge in-out robot 70 and the cartridge arranging robot 78 to transfer the target cartridge 92 from the address of the component storage block which have stored the cartridge to the location to be set on the pallet.

Based on this instruction, the cartridge in/out robot 70 operates to take out the cartridge loaded with the components to be arranged on the pallet 90 from the storages 68a and 68b, and places it on the cartridge delivery unit 82. Then, the cartridge arranging robot 78 grasps the cartridge resting on the cartridge delivery unit 82, and sets it on the pallet 90 at the predetermined mounting location. The cartridge in/out robot 70 and the cartridge arranging robot 78 repeat in cooperation such procedure for arranging pallets until the instructed operation is completed.

The pallet 90 which has undergone the arranging operation is disengaged from a positioning lock at the pallet arrangement section B (FIG. 6) and loaded on the automatic conveying conveying vehicle 26 by the upper conveyor 74a and the pallet lifter 76a. The pallet 90 is then transferred to the predetermined location by the automatic conveying vehicle 26 and stored within the storages 20a and 20b.

Figure 10:
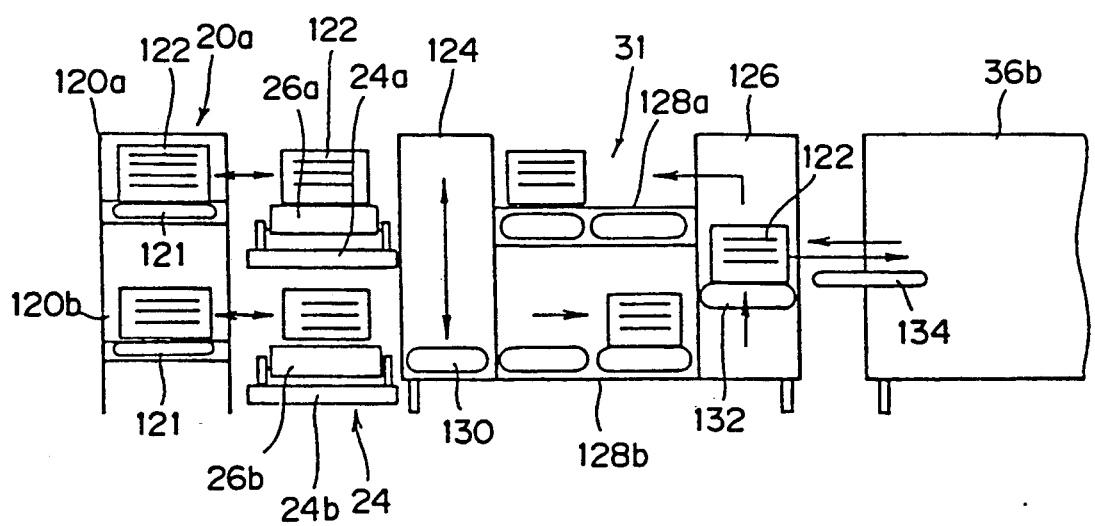
FIG. 10 is a sectional view taken along a line X—X of FIG. 4.

Referring to FIG. 10, there is shown a sectional view taken along line X—X of FIG. 4. As is apparent from this drawing, storages 20a and 20b, conveyance passage 24 and loader/unloader 31 are of a two-stage or two-part structure consisting of upper and lower parts. More specifically, the storage 20a comprises an upper storage 120a and a lower storage 120b, each having a bottom surface provided with a conveyor 121 for allowing a rack 122 to be introduced into and taken out from the corresponding storage.

Figure 11:
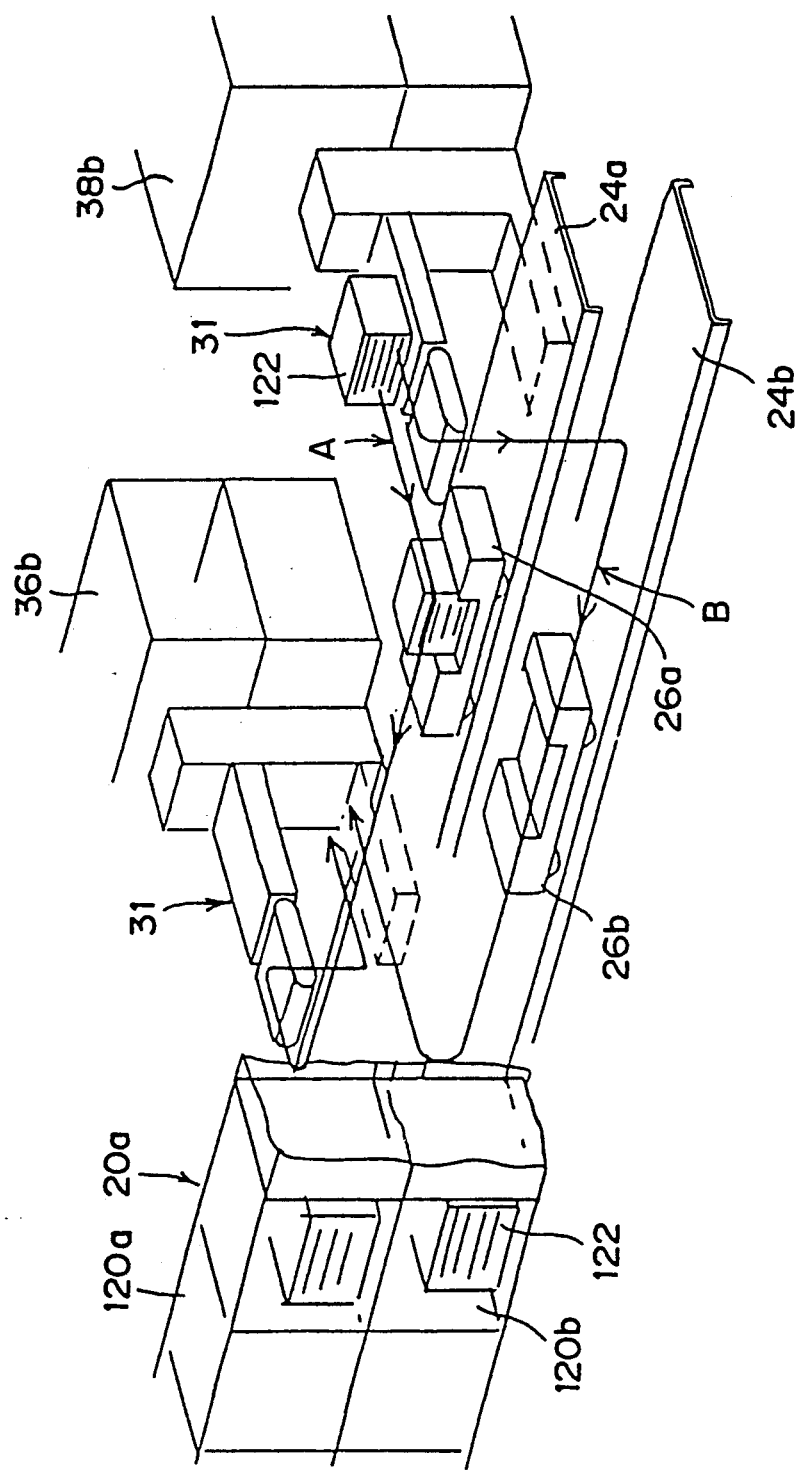
FIG. 11 is a schematic perspective view of the production system shown in FIG. 10.

As seen from FIG. 11, the conveyance passage 24 comprises an upper conveyance passage 24a and a lower conveyance passage 24b, each having a track thereon. Automatic conveying vehicles 26a and 26b travel along the conveyance passages 24a and 24b, respectively. The travel of the automatic conveying vehicles 26a and 26b on their respective tracks enables them to speed up to about 60 m/min. Although not shown in particular, the automatic conveying vehicles 26a and 26b also include workpiece delivery means such as conveyors which cause a workpiece such as a rack 122 to be introduced into and taken out from the storages 120a and 120b. In lieu of workpiece delivery conveyors, respectively, on the storages 120a and 120b and automatic conveying vehicles, arms may be provided for grasping the workpieces and delivering them on the automatic conveying vehicles 26a and 26b.

The loader/unloader 31 comprises an upper conveyance passage 128a and a lower conveyance passage 128b interposed between a pair of lifters 124 and 126. The lifters 124 and 126 include therein vertically displaceable lifter conveyors 130 and 132, respectively. The racks 122 within the lifter 126 are introduced into the processing unit 36b by means of a conveyor 134.

FIG. 11 shows a schematic perspective view of the arrangement of FIG. 10. As is clear from this drawing, for the transfer of the rack 122 from the processing unit 38b to the other processing unit 36b, there are provided a route A using the upper conveying vehicle 26a and a route B using the lower conveying vehicle 26b. The alternative of the conveying vehicles to be used is given to a conveying vehicle controlling system for selecting an optimal conveyance route. Any loading or unloading by the two automatic conveying vehicles with respect to the same processing unit is to be prohibited, because the loader/unloader 31 associated with each processing unit has only one lifter 124 adjacent to the conveyance passage 24 so that loading or unloading is permitted with respect to either upper stage or lower stage, which causes one of the automatic conveying vehicles to wait.

Figure 12:
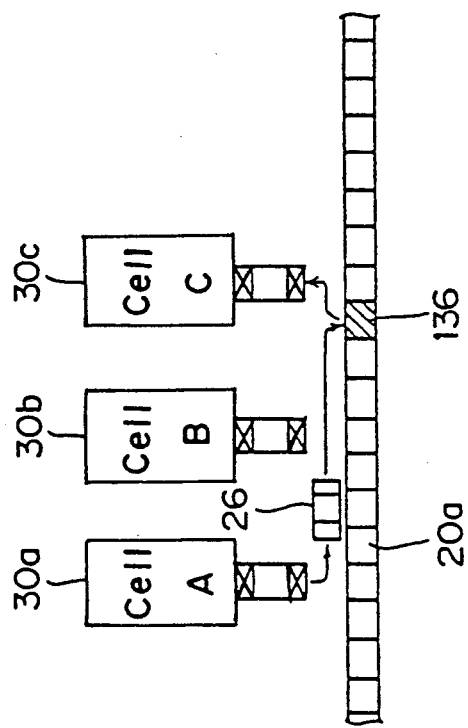
FIG. 12 is an explanatory view of the conveyance of parts between the processing units by way of a storage device.

In order to minimize a delivery loss involved in the operation of storing a workpiece into the storage 20a, the workpiece may be stored into an address 136 located between a shipment cell or unit 30a and a destination cell or unit 30c, as shown in FIG. 12. Moreover, in view of the subsequent processing at the destination cell or unit 30c, the store address should be as close to the destination cell or unit 30c as possible.

Figure 13:
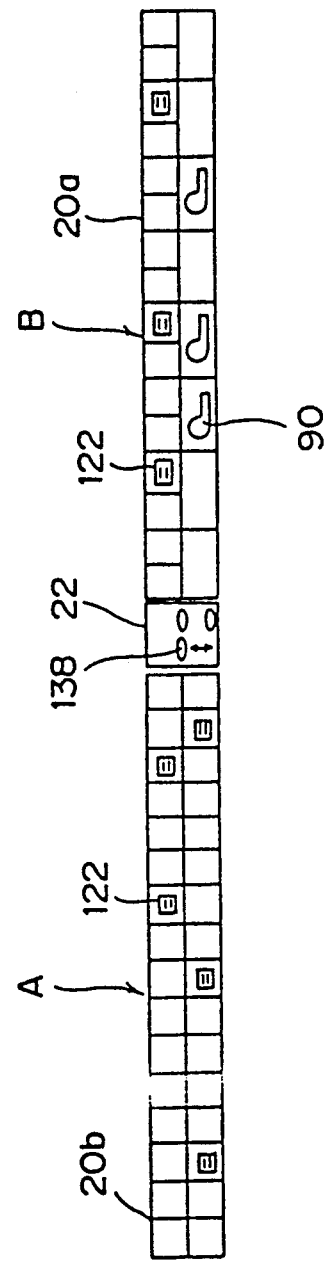
FIG. 13 is a front elevation of the storage device shown in FIG. 4.

Referring next to FIG. 13, the manner of storing the workpieces into the storages 20a and 20b will be explained. Between the storages 20a and 20b, there is interposed a rack delivery section 22 having a lifter 138. In zone A including the storage 20b, the upper and lower stages or parts thereof are each intended to store racks 122 containing printed circuit boards therein, and have their respective automatic conveying vehicles 26 thereon for conveying the racks 122.

In zone B, the upper part of the storage 20a stores the racks 122 while the lower part thereof stores pallets 90 loaded with cartridges 92. Correspondingly, the automatic conveying vehicle 26a traveling on the upper part carries the racks 122 while the automatic conveying vehicle 26b on the lower part carries the pallets 90. In this manner, the rack delivery section 22 intervenes between the storages 20a and 20b, and the four automatic conveying vehicles 26 in total, two for each of the storage parts, are controlled to return to the middle of the conveyance passage 24, thereby shortening the traveling distance of the automatic conveying vehicle 26 to improve efficiency.

Figure 14:
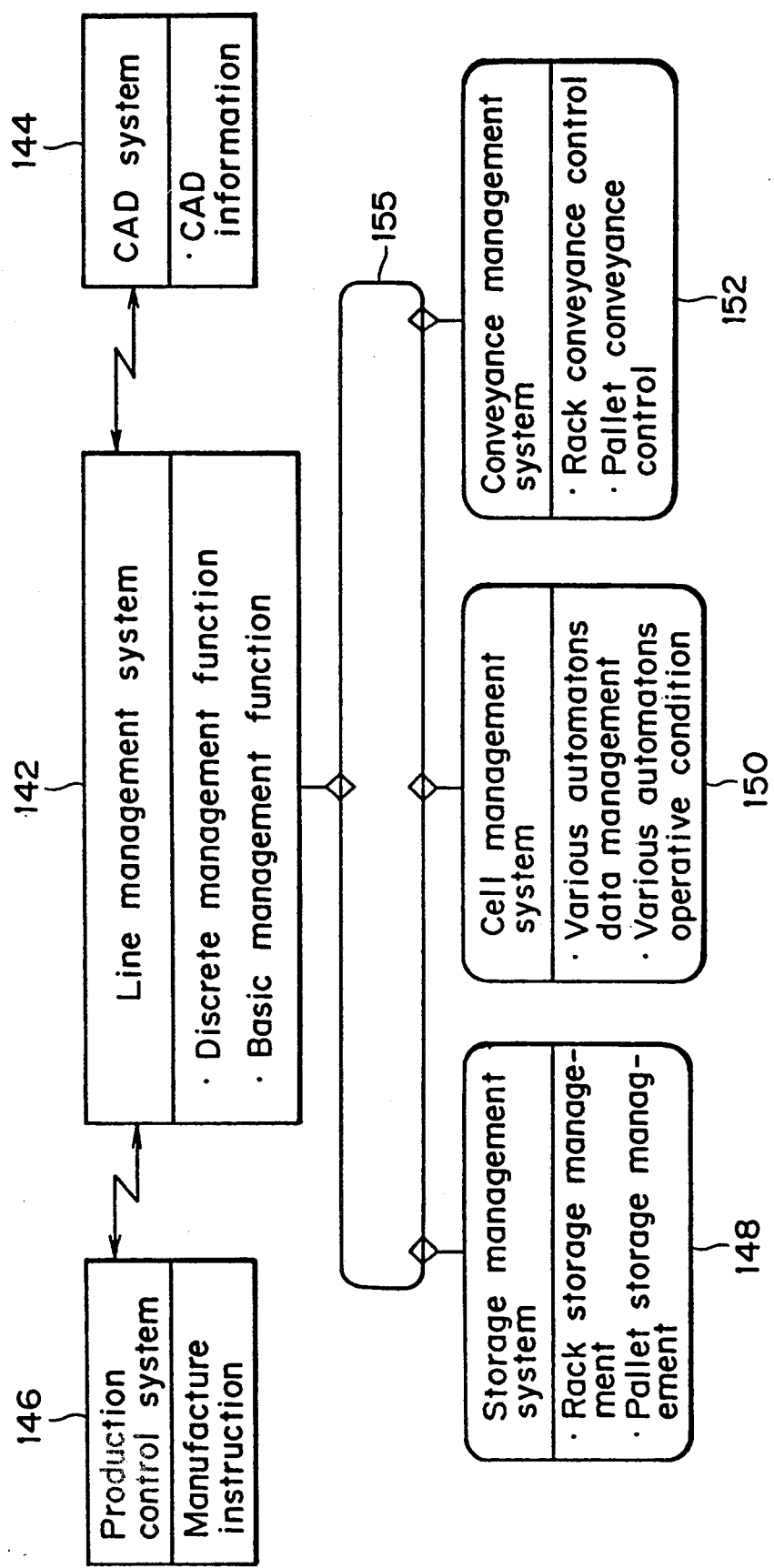
FIG. 14 shows a control system for the production system.

Referring now to FIG. 14, description will be made of the control system for the production line. A line management system 142 which is a basis system for managing the entire production line has discrete management functions such as order management, CMA data management and member management, and management, as well as basic management functions such as pallet arrangement and loading control.

The line management system 142 is connected via a data bus 155 to a storage management system 148, a cell management system 150 and a conveyance management system 152. Units 144 and 146 represent a CAD system and a production control system, respectively, and are both operatively connected to the line management system 142, as shown in FIG. 14. The storage management system 148 has a rack storage management function and a pallet storage management function. The cell management system 150 manages data of the processing cells while monitoring the operative conditions thereof. Furthermore, the conveyance management system 152 executes a rack conveyance control and a pallet conveyance control.

Figure 15:
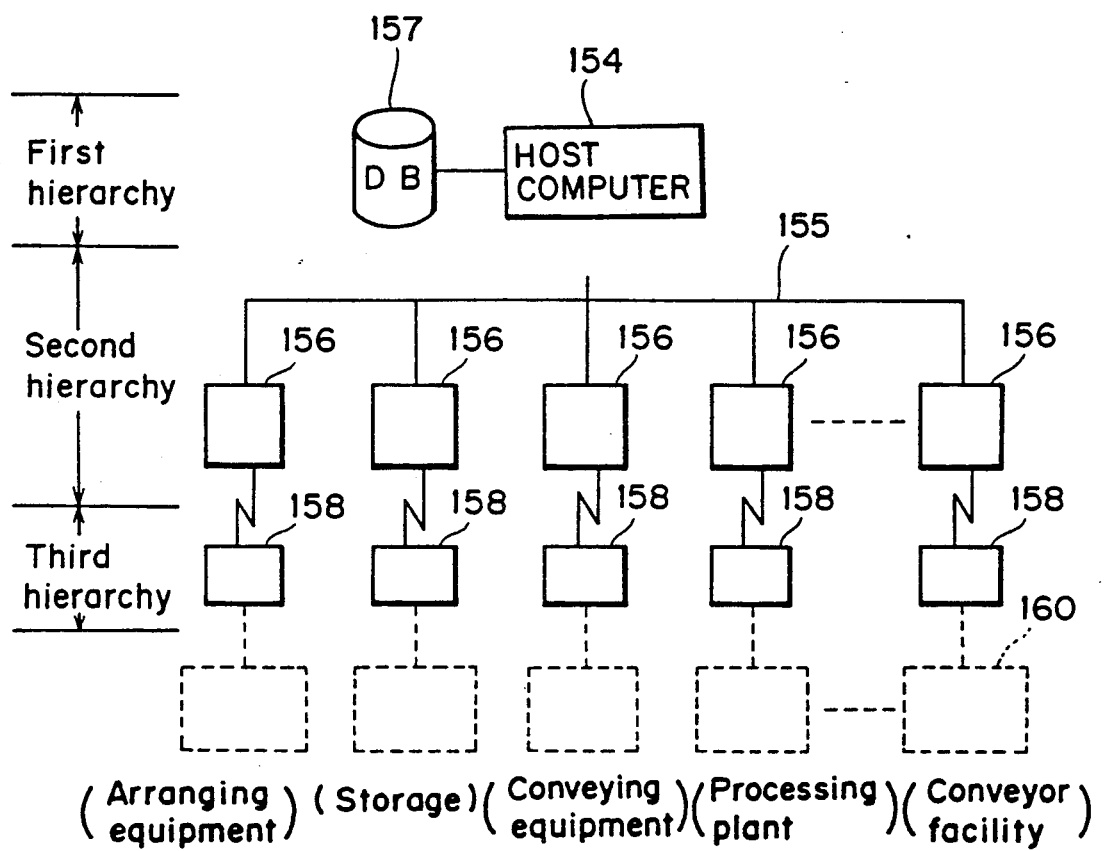
FIG. 15 shows a hierarchical structure of the control system.

The control system for the production line of this embodiment has a hierarchical structure as shown in FIG. 15. A host computer 154 belongs to the first hierarchy controls and manages the entire production line. In other words, the host computer 154 functions as the line management system 142 in FIG. 14. The computer 154 is the first hierarchy is connected via a data bus 155 to a plurality of additional computers 156 in the second hierarchy which manage the operative conditions of the processing cells 160 corresponding to processing cells 30a, 30b and 30c described herein above and transmit instructions from the host computer 154 in the first hierarchy to the processing cells. The computers 156 in the second hierarchy are connected to the corresponding controllers 158 which belong to the third hierarchy and control the actions of the processing cells. Each of the controllers 158 in the third hierarchy comprises a sequencer, a personal computer or the like.

In this manner, the present embodiment allows the first hierarchy's computer 154 to centralize the management of the production line and the second hierarchy's computers 156 to decentralize the control and the management of the processing cells. A distributed processing of control can thus be realized.

The computer 154 in the first hierarchy previously holds together information required to control the processing cells in the form of a data base 157. Due to the linkage via the data bus between the second hierarchy's computers 156 and the first hierarchy's computer 154, the computers 156 in the second hierarchy determine by themselves the attributes (drawing numbers, names of NC data orders, etc.), associated with racks transferred into the processing cells with reference to the data base 157 via the data bus 155, and control each of the processing cells independently without requiring any instruction from the computer 154 in the first hierarchy.

Employment of distributed processing of control based on such hierarchal structure eliminates not only the necessity of the real time communication between the first hierarchy's computer and the second hierarchy's computers, but also the necessity of modifying the program of the line management system 142 for newly added processing cells. In addition, the distributed processing allows the first hierarchy's computer 154 to be less loaded.

Figure 16:
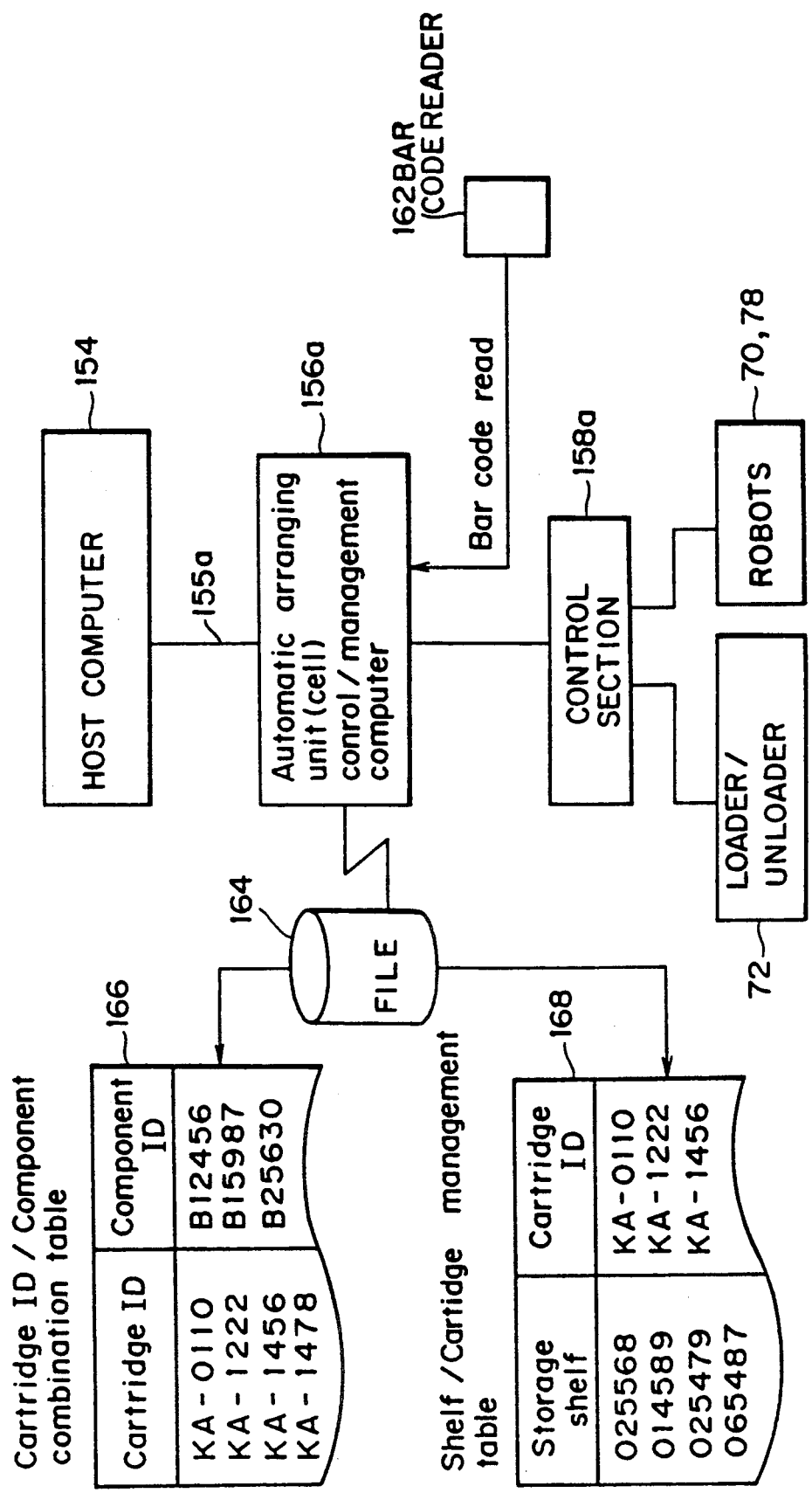
FIG. 16 is a control block diagram of the automatic on-pallet cartridge arranging unit

The control of the automatic cartridge arranging unit 28 will be hereinafter described with reference to FIG. 16. A computer 156a which exclusively controls and manages the automatic cartridge arranging unit 28 is connected via a data bus 155a to the first hierarchy's computer 154 which controls and manage the overall system.

Upon loading the chip component reel 95 into the cartridge 92, the bar code reader 162 reads their respective bar codes to store a cartridge ID/component combination table 166 into a file 164 of the computer 156a.

The arranging unit control section 158a which corresponds to the third hierarchy's controller serves to control the robots 70 and 78 as well as the loader/unloader 72. When the predetermined cartridge is stored in the predetermined address of the component storages 68a and 68b by the cartridge in/out robot 70, a shelf/cartridge management table 168 is registered into the file 164. Through the reference to the two tables 166 and 168, it can be recognized which component is stored in the predetermined address of the component storages 68a and 68b.

In the present invention as described above in detail, components to be mounted are previously automatically arranged on a pallet according to the mounting sequence by the use of the automatic cartridge arranging unit, and the resultant pallet is supplied into one of the processing cells, thereby ensuring an effective flexible manufacture of the printed circuit boards.

Moreover, the provision of the storages along the conveyance passage extending across the processing cells enables the workpieces to be stored within the optimum location of the storages for the prompt supply into the processing cells, which leads to an improvement in the productivity of the printed circuit boards.

What is claimed is:

1. A system for manufacturing printed circuit boards, the system comprising:
   a plurality of processing units which carry out a plurality of processing functions on printed circuit boards;
   an automatic cartridge arranging unit for automatically mounting cartridges each having predetermined electronic components thereon onto a pallet in accordance with a predetermined sequence, said cartridge arranging unit including component storage units for storing electronic components therein and an automatic robot;
   conveyance passages extending along said plurality of processing units and said automatic cartridge arranging unit;

storage means for storing pallets and being positioned along said conveyance passages opposite to said plurality of processing units and said automatic cartridge arranging unit;

pallet conveying means travelling on said conveyance passages and carrying pallets and racks loaded with a plurality of printed circuit boards, said conveying means travelling along said plurality of processing units, said automatic cartridge arranging unit and said storage means; and a control means for controlling said plurality of processing units, said automatic cartridge arranging unit, said storage means and said conveying means in accordance with a predetermined work scheme.

2. A system for manufacturing printed circuit boards according to claim 1, wherein said control means includes a host computer in the first hierarchy which manages the entire system while monitoring operative conditions of the entire system, and a plurality of additional computers in the second hierarchy coupled to said host computer by a data bus and provided respectively on said plurality of processing units, said automatic cartridge arranging unit, said storage means and said conveying means, said additional computers transmitting instructions from said host computer to said plurality of processing units, said automatic cartridge arranging unit, said storage means and said conveying means while monitoring the operative conditions thereof.

3. A system for manufacturing printed circuit boards according to claim 1, wherein said conveyance passages are of a two-part structure, correspondingly to which said storage means for storing pallets are of a two-part structure, and said conveying means travel on respective parts of said conveyance passages.

4. A system for manufacturing printed circuit boards according to claim 3, wherein at least one delivery unit is provided having a lifter and interposed between said storage means positioned along different parts of said conveyance passages.

5. A system for manufacturing printed circuit boards according to claim 1, wherein said electronic components are mounted on said cartridges stored into said component storage units and transmitted onto respective pallets.

6. A system for manufacturing printed circuit boards according to claim 5, wherein said automatic cartridge arranging unit further comprises a pallet loading/unloading means which loads and unloads said pallets, and wherein said automatic robot includes a cartridge loading and unloading robot for introducing cartridges into said component storage units and taking out said cartridges from said storage units, and a cartridge mounting robot for mounting a cartridge onto a pallet supplied into a predetermined position by said pallet loading/unloading means, said cartridge mounting robot removing said cartridge from said pallet in the case when a vacant cartridge or a halfway used cartridge is mounted on said pallet.

7. A system for manufacturing printed circuit boards according to claim 6, wherein said automatic cartridge arranging unit further comprises a cartridge delivery means temporarily holding a cartridge for the delivery thereof between said cartridge loading and unloading robot and said cartridge mounting robot.

8. A system for manufacturing printed circuit boards according to claim 1, further comprising loading/unloading means correspondingly disposed between said plurality of processing units and said conveyance passages, respectively, said loading/unloading means supplying said pallets and said racks into corresponding processing units and discharging said pallets and racks from said processing units.

9. A method of manufacturing printed circuit boards for automatically mounting desired electronic components onto printed circuit boards, comprising the steps of:

preliminarily setting electronic components with an identifier into a cartridge also having an identifier;

reading separately identifiers of said electronic components and said cartridge to register obtained setting data into an automatic arrangement controlling computer;

storing said cartridge whose setting data have been registered into any address of a component storage unit provided in an automatic cartridge arranging unit while registering said address into said automatic arrangement controlling computer;

positioning a pallet with an identifier into a predetermined position on the automatic cartridge arranging unit and registering said identifier of said pallet into said automatic arrangement controlling computer;

generating data of locations of cartridges to be set on said positioned pallet and data of components to be set by said automatic arrangement controlling computer in accordance with predetermined programs corresponding to drawing numbers and data regarding stocks within said component storage units;

setting applicable cartridges onto said pallet by an automatic robot on the basis of said data of locations of the cartridges to be set and data of electronic components to be set so as to automatically position said cartridges on said pallet;

transporting said pallet on which positioning of cartridges has been completed to automatic component mounting machines; and removing said electronic components from said pallet having the cartridges by said automatic component mounting machines to automatically mount said electronic components onto each printed board at predetermined positions.

10. A method of manufacturing printed circuit boards according to claim 9, wherein said pallet on which the positioning of cartridges has been completed, and a rack loaded with the printed circuit boards, are temporarily stored in said storages.

* * * * *